United States Patent [19]

Sun et al.

[11] Patent Number: 5,556,830
[45] Date of Patent: Sep. 17, 1996

[54] TL-DOPED HGBACACU SUPERCONDUCTORS

[75] Inventors: Guifu Sun; Kai W. Wong; Ying Xin, all of Lawrence, Kans.

[73] Assignee: Midwest Superconductivity, Inc., Lawrence, Kans.

[21] Appl. No.: 251,606

[22] Filed: May 31, 1994

[51] Int. Cl.$^6$ ............. H01L 39/12; C04B 35/00; C04B 35/45; C04B 35/057
[52] U.S. Cl. .......... 505/125; 505/126; 505/120; 505/501; 505/783; 252/521; 501/123
[58] Field of Search .................. 252/521; 501/123; 505/125, 126, 120, 501, 783

[56] References Cited

U.S. PATENT DOCUMENTS 5,300,482  4/1994  Doi et al. .................. 505/120

FOREIGN PATENT DOCUMENTS 356231   2/1990  European Pat. Off. .
2229716  9/1990  Japan .

OTHER PUBLICATIONS

Meng et al.; Synthesis of the High–Temperature Superconductors $HgBa_2CaCu_2O_{6+\delta}$ and $HgBa_2Ca_2Cu_3O_{8+\delta}$, *Physica*, C216 (1993) 21–28 month not known.

Sun, G. F., et al., "$T_c$ Enhancement of $HgBa_2Ca_2Cu_3O_{8+}$ by Tl Substitution", *Physics Letter A*, 192(1) (29 Aug. 1994), 122–4.

Goutenoire, F., et al., "Substitution of Mercury for Thallium in the 2223–Cuprate: The 130K–Superconductor $Tl_{1.6}Hg_{0.4}Ba_2Ca_2Cu_3O_{10-x}$", *Solid State Communications*, 90(1) (Apr. 1994), 47–50.

Gupta, Raju P., et al., "Mechanism of hole doping in Hg–based cuprate superconductors", *Physica C*, 223 (Nos. 3 & 4) (10 Apr. 1994), 213–218.

Xin Y., et al., "Optimum preparation and elemental addition for Tl–based 2223 phase $Tl_2Ba_2Ca_2Cu_3O_{10-\delta}$", *Physica C*, 184 (Nos. 1–3) (1 Dec. 1991), 185–189.

*Primary Examiner*—Douglas J. McGinty
*Attorney, Agent, or Firm*—Hovey, Williams, Timmons & Collins

[57] ABSTRACT

Improved superconducting oxides are provided having the general formula $(Hg_{1-x}Tl_x)Ba_2Ca_{n-1}Cu_nO_{2n+2+\alpha}$ where x is from about 0.05–0.5 and n is 1, 2, 3 or 4, and $\alpha$ is an oxygen enrichment factor. The Tl-doped oxides exhibit very high $T_c$ and $J_c$ values.

4 Claims, 4 Drawing Sheets

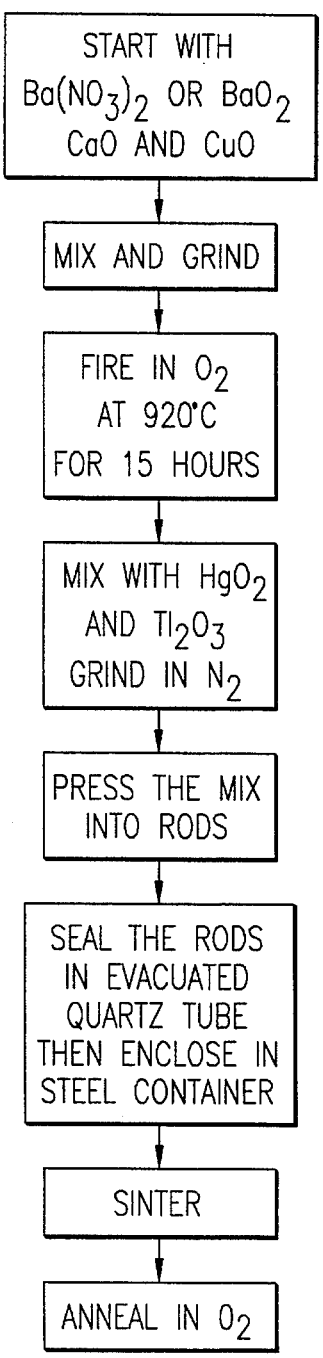
FIG. 1.
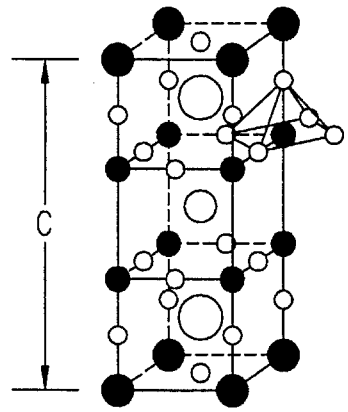
○ O
● Cu
● Hg,Tl
○ Ca
○ Ba
LEGEND FOR
FIG.2A., FIG.2B., FIG.2C.
FIG. 2A.
FIG. 2B.
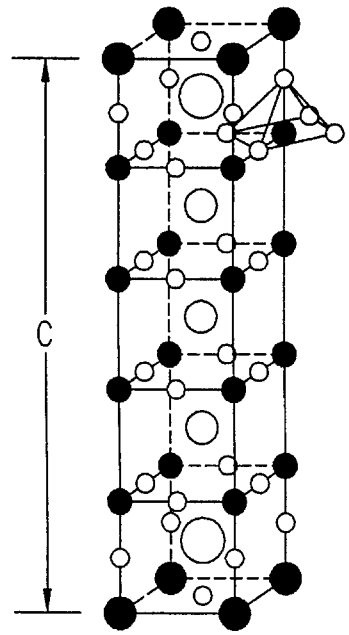
FIG. 2C.
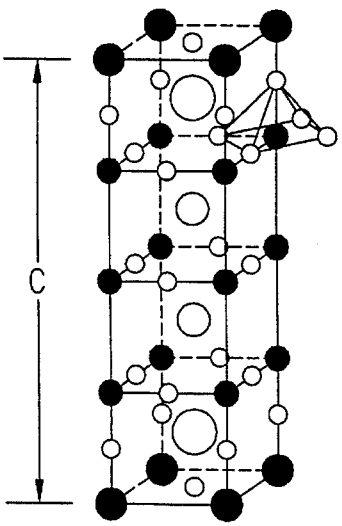

5,556,830

1

TL-DOPED HGBACACU SUPERCONDUCTORS

BACKGROUND OF THE INVENTION

1. Field of the Invention

The present invention is concerned with improved high temperature superconducting oxides of the HgBaCaCu family which are doped with thallium. These superconducting oxides exhibit high $T_c$ and $J_c$ values and are suitable for use with cryogenic systems operating at about the

2. Description of the Prior Art

The homologous series of superconductors $HgBa_2Ca_{n-1}Cu_nO_{2n+2+\alpha}$ has recently been reported. These oxides possess relatively high $T_c$ values on the order of 135K. However, the Hg plane of the resultant crystalline structures is very oxygen deficient, which limits the potential $T_c$ values of this family of superconductors. Moreover, this type of superconducting oxide is very difficult to economically manufacture, owing to the volatility of the Hg present, and the tendency of the oxides to adversely react with water vapor and carbon dioxide during the manufacturing process.

There is accordingly a need in the art for improved Hg-based superconducting oxides which are more readily manufactured and which have a higher oxygen content and $T_c$ values.

SUMMARY OF THE INVENTION

The present invention overcomes the problems outlined above and provides improved Tl-doped Hg superconducting oxides. The improved oxides exhibit high $T_c$ values in excess of 140K. Accordingly, the oxides of the invention may be successfully used under cryogenic temperatures close to the liquid/vapor balance for nitrogen (about 125K).

In preferred forms, the oxides of the invention have the general formula $(Hg_{1-x}Tl_x)Ba_2Ca_{n-1}Cu_nO_{2n+2+\alpha}$ where x is from about 0.05–0.5 and n is 1, 2, 3 or 4, and $\alpha$ is an oxygen enrichment factor ranging from about 0–1. Advantageously, x should range from about 0.1–0.3, and n should be either 2, 3 or 4. Especially preferred oxides are the Tl-doped 1212, 1223 and 1234 oxides.

The oxides of the invention are manufactured by first forming a BaCaCuO precursor, followed by mixing the precursor with HgO and $Tl_2O_3$. Thereafter, the mixed material is pressed into rods or the like, enclosed in an evacuated quartz tube, and sintered at a temperature of from about 800°–900° C., and more preferably from about 830°–870° C. Thereafter, the sintered oxides are annealed in oxygen at a temperature of 300°–700° C.

BRIEF DESCRIPTION OF THE DRAWINGS

FIG. 1 is a flow diagram setting forth the preferred steps followed in the manufacture of the Hg/Tl superconductors of the invention;

FIG. 2A is a schematic representation of the crystalline structure of a 1212 Hg/Tl superconductor in accordance with the invention;

FIG. 2B is a schematic representation of the crystalline structure of a 1234 Hg/Tl superconductor in accordance with the invention;

FIG. 2C is a schematic representation of the crystalline structure of a 1223 Hg/Tl superconductor in accordance with the invention;

2

Figure 3:
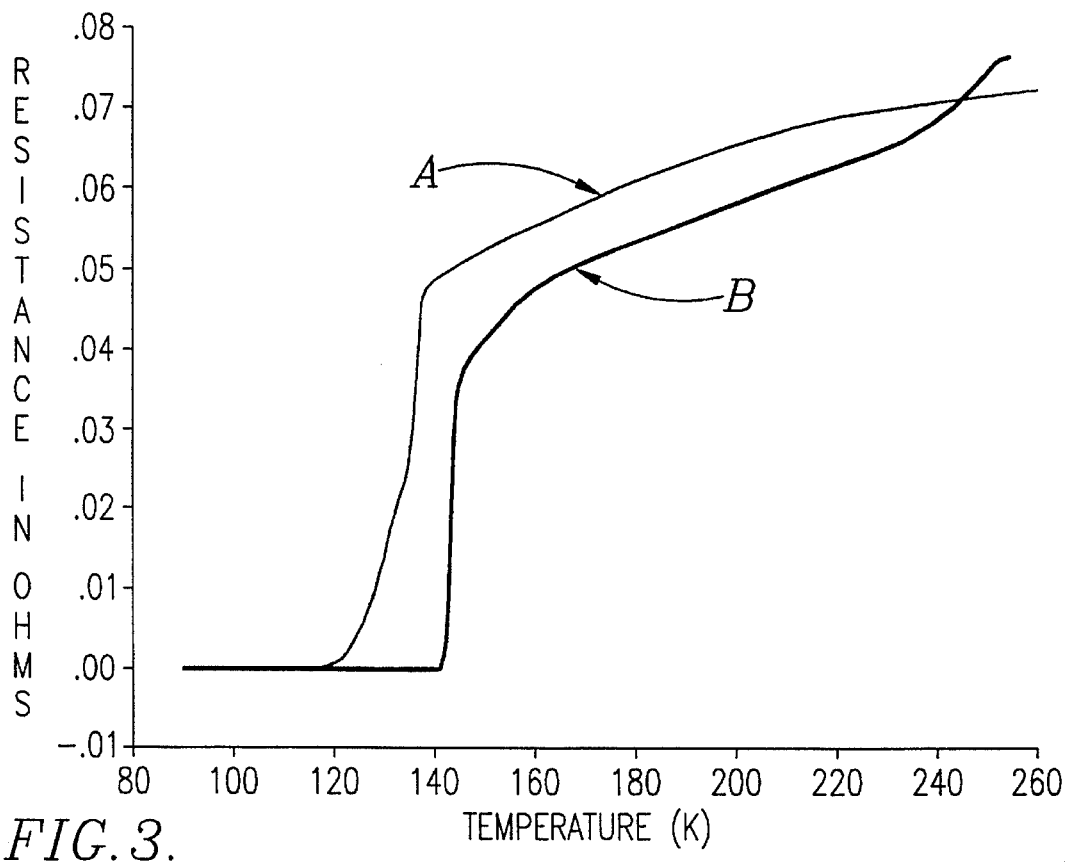
Figure 4:
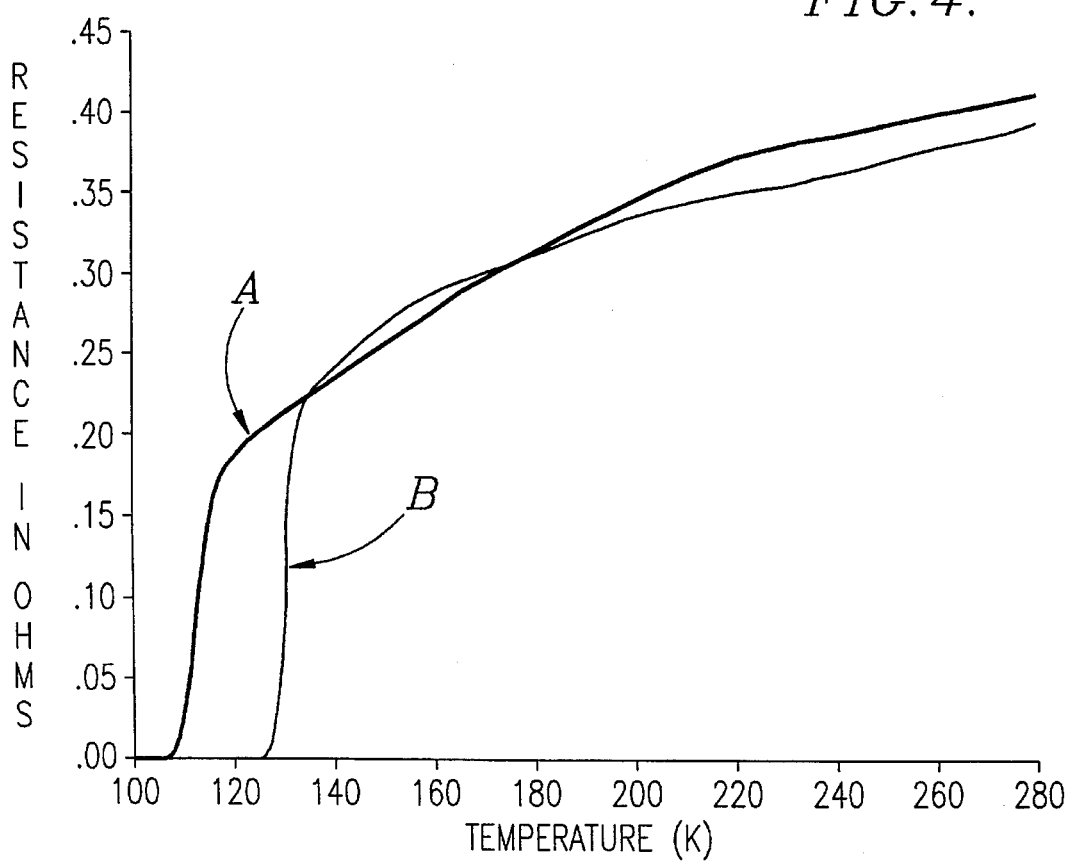
Figure 5:
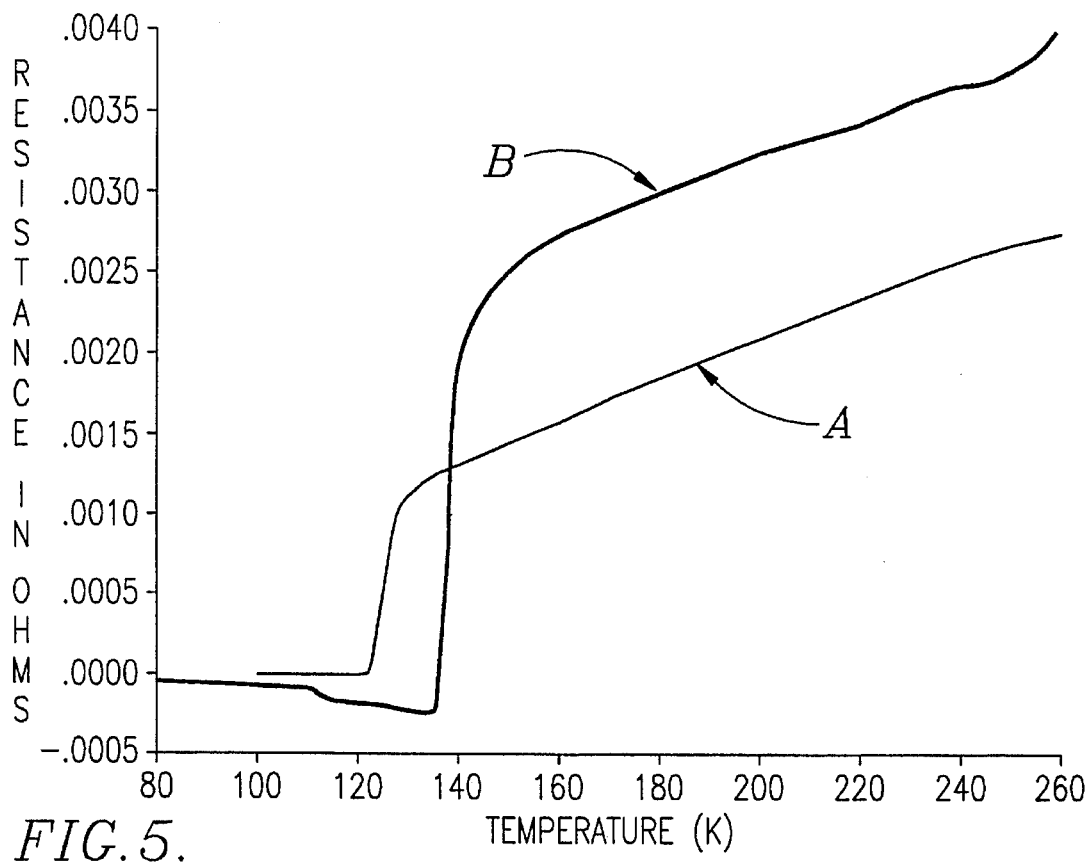
Figure 6:
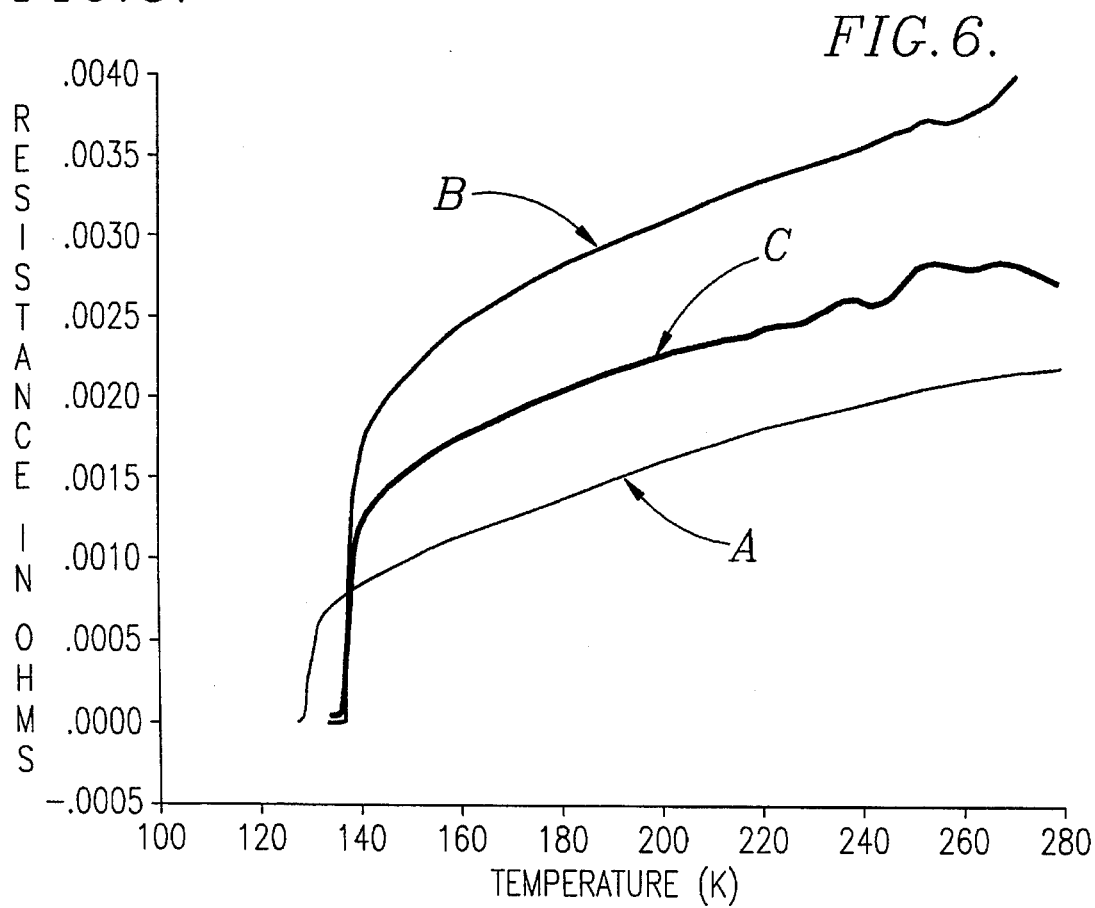
Figure 7:
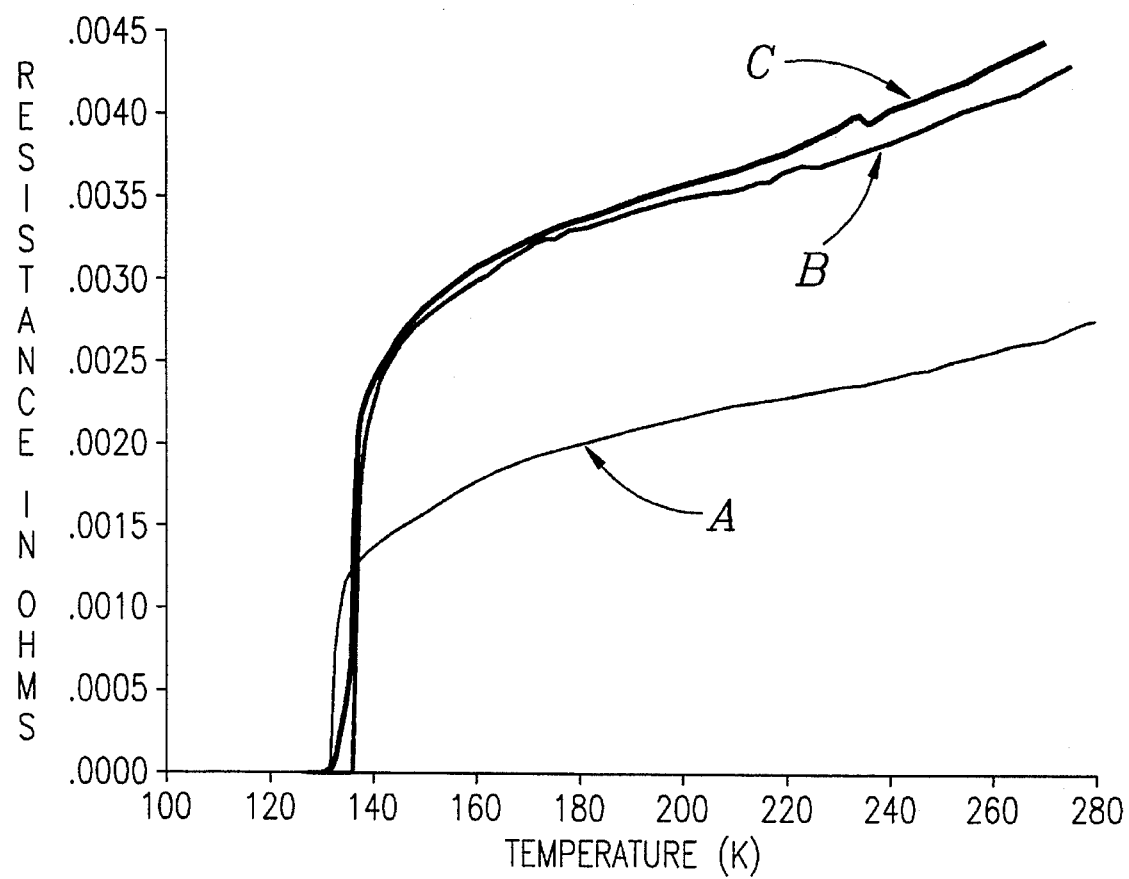

FIG. 3 is a graph illustrating the resistance versus temperature values and $T_c$ values for the superconducting oxide $(Hg_{0.9}Tl_{0.1})Ba_2Ca_2Cu_3O_{8+\alpha}$, after sintering (line A) and after annealing at 500° C. (line B);

FIG. 4 is a graph illustrating the resistance versus temperature values and $T_c$ values for the superconducting oxide $(Hg_{0.9}Tl_{0.1})Ba_2CaCu_2O_{6+\alpha}$, after sintering (line A) and after annealing at 300° C. (line B);

FIG. 5 is a graph illustrating the resistance versus temperature values and $T_c$ values for the superconducting oxide $(Hg_{0.7}Tl_{0.3})Ba_2Ca_3Cu_4O_{10+\alpha}$, after sintering (line A) and after annealing at 700° C. (line B);

FIG. 6 is a graph illustrating the resistance versus temperature values and $T_c$ values for the superconducting oxide $(Hg_{0.8}Tl_{0.2})Ba_2Ca_3Cu_4O_{10+\alpha}$, after sintering (line A), after annealing at 500° C. (line B), and after annealing at 700° C. (line C); and FIG. 7 is a graph illustrating the resistance versus temperature values and $T_c$ values for the superconducting oxide $(Hg_{0.75}Tl_{0.25})Ba_2Ca_3Cu_4O_{10+\alpha}$, after sintering (line A), after annealing at 500° C. (line B), and after annealing at 700° C. (line C).

DETAILED DESCRIPTION OF THE PREFERRED EMBODIMENTS

FIG. 1 sets forth the basic steps in the preferred fabrication technique. Generally speaking, a BaCaCuO precursor is first formed by mixing the appropriate molar quantities of $Ba(NO_3)_2$ or $BaO_2$ with CaO and CuO, followed by grinding and firing at a temperature of from about 850°–900° C. for a period of from about 5–20 hours; oxygen is continuously passed through the furnace during firing.

Thereafter, the fired powders are mixed with HgO and $Tl_2O_3$ in a nitrogen filled bag in order to minimize adverse reactions with water vapor and carbon dioxide. The mixed powders are then ground in the bag and are pressed into rods or other convenient shapes using rapid uniaxial pressing.

In final processing, the pressed bodies are placed in an evacuated quartz tube and are first sintered in a preheated furnace (from about 800°–900° C., more preferably from about 830°–870° C.) for a period of from about 120–1200 minutes, more preferably from about 300–600 minutes. After sintering, the bodies are annealed under continuous oxygen flow conditions at a temperature below the sintering temperature. Preferably, the annealing takes place at an ascending temperature rate of from about 1°–5° C./min. to a maximum set temperature of from about 300°–700° C. This set temperature is held for a period of from about 5–30 hours, whereupon the furnace is cooled at a rate of from about 1°–20° C./min.

FIGS. 2A–2C illustrate the crystalline structure of three preferred Tl-doped superconducting oxides in accordance with the invention, namely the 1212, 1234 and 1223 oxides. FIGS. 3–7 are representative resistance versus temperature curves for oxides in accordance with the invention, and confirm post-annealing $T_c$ values of up to 141K.

The following example illustrates preferred embodiments of the invention and use thereof. It is to be understood, however, that this example is presented by way of illustration only and nothing therein should be taken as a limitation upon the overall scope of the invention.

EXAMPLE

A series of Hg/Tl superconducting oxides were prepared as follows. In the first step, Ba—Ca—Cu—O precursors were formed using $Ba(NO_3)_2$(99.9%) or $BaO_2$(95%, $BaO_2$+ BaO>99.5%), CaO(>99.5%), and CuO(>99.95%) at molar ratios of Ba/Ca/Cu of 2/1/2, 2/2/3, or 2/3/4 by mixing the starting oxides and grinding in an agate mortar. The ground powders were ground to a size of 0.5–5 μm. The powders were then put into an alumina boat and fired in a tube furnace. Oxygen was passed continuously through the furnace tube during the solid state reaction. The temperature of the furnace was raised at a rate of 20° /min. from room temperature to 920° C. The furnace temperature was kept at 920° C. for 15 hours. Finally, the furnace was cooled to room temperature by switching off the power. The fired precursors were then kept in a dry box.

HgO and $Tl_2O_3$ were then mixed with the precursors in a plastic, nitrogen-filled bag. Sufficient Hg and $Tl_2O_3$ were used to provide cation ratios of $(Hg_{1-x}Tl_x)$/Ba/Ca/Cu of 1212, 1223 and 1234. The mixtures were ground in the bag to achieve a final particle size for the mixed powders of 0.5–5 μm. The ground powders were then pressed into rods of 6 mm diameter and 15 mm length using a uniaxial pressure of $10^7$ tons/cm$^2$. The pressing was finished quickly (less than 2 minutes in most cases) to avoid absorption of water vapor and other harmful gases by the rods.

The pressed rods were then put into a quartz tube and the latter was evacuated using a mechanical pump to achieve a pressure of less than 1 Pa. For additional protection, the sealed quartz tube was enclosed in a high temperature oxygen-proof steel cylindrical container.

A tube furnace was initially heated up to 860° C., and the steel tube with the quartz tube therein was placed into the furnace and kept therein at 860° C. for 400 minutes. The furnace was then turned off. After the contents cooled to room temperature, the quartz tube was removed from the steel container and broken to retrieve the sintered rods.

In order to improve the superconducting properties of the rods, the latter were annealed in oxygen. In the annealing process, the samples were put into an alumina crucible and placed in a tube furnace; oxygen was continuously passed through the furnace during the entire annealing process (both heating and cooling). The temperature of the furnace was raised at a rate of 5° C./min. to an elevated set temperature (usually in the range of from 300°–700° C.) and kept at the set temperature for 10 hours At the end of the 10 hour period, the furnace was cooled at a rate of 2° C./min., and the samples were kept in the furnace until the furnace reached room temperature.

The individual rods were tested to measure their $T_c$ values after sintering and again after the annealing process. The results of this testing is set forth in FIGS. 3–7. In FIGS. 3–5, line A represents the resistance values determined for the unannealed oxides, whereas line B gives the resistance values for the oxides annealed in oxygen at 300°–700° C. In FIGS. 6 and 7, line A represents the resistance values determined with the unannealed oxides, whereas line B is for the oxides annealed at 500° C., and line C is for the oxides annealed at 700° C.

We claim:

1. Superconducting oxides having the general formula $(Hg_{1-x}Tl_x)Ba_2Ca_{n-1}Cu_nO_{2n+2+\alpha}$ where x is from about 0.1 to about 0.3 and n is 2, 3, or 4, and $\alpha$ is an oxygen deficiency factor ranging from about 0 to about 1.

2. The oxides of claim 1, wherein n is 2.

3. The oxides of claim 1, wherein n is 3.

4. The oxides of claim 1, wherein n is 4.

* * * * *